(12) United States Patent
Khoury

(10) Patent No.: US 11,894,864 B2
(45) Date of Patent: Feb. 6, 2024

(54) ANALOG-TO-DIGITAL CONVERTER HAVING PUNCTURED QUANTIZER

(71) Applicant: Silicon Laboratories Inc., Austin, TX (US)

(72) Inventor: John M. Khoury, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 17/701,742

(22) Filed: Mar. 23, 2022

(65) Prior Publication Data

US 2023/0308111 A1 Sep. 28, 2023

(51) Int. Cl.
| | |
|---|---|
| *H03M 3/00* | (2006.01) |
| *H04R 3/00* | (2006.01) |
| *H04R 3/04* | (2006.01) |
| *H04R 3/02* | (2006.01) |
| *H03F 3/183* | (2006.01) |

(52) U.S. Cl.
CPC .......... *H03M 3/422* (2013.01); *H03F 3/183* (2013.01); *H03M 3/356* (2013.01); *H03M 3/458* (2013.01); *H04R 3/02* (2013.01); *H04R 3/04* (2013.01); *H03F 2200/03* (2013.01)

(58) Field of Classification Search
CPC .......... H03M 1/34; H03M 1/361; H03M 3/39; H03M 3/42; H03M 3/412; H03M 3/422; H03M 3/424; H03M 3/458; H03M 3/352; H03M 3/356; H03M 3/50; H03M 7/3004; H03M 7/3011; H03M 7/3015; H03M 7/3026; H04R 3/00; H04R 3/02; H04R 3/04; H04R 3/005; H03F 3/181; H03F 3/183; H03F 2200/03
See application file for complete search history.

(56) References Cited

U.S. PATENT DOCUMENTS

| | | | | |
|---|---|---|---|---|
| 5,565,868 A | * | 10/1996 | Azrouf | H03M 3/41 |
| | | | | 341/143 |
| 5,736,950 A | * | 4/1998 | Harris | H03M 3/396 |
| | | | | 341/166 |
| 8,749,417 B2 | | 6/2014 | Coban et al. | |
| 9,246,509 B1 | * | 1/2016 | Bhargava | H03M 3/464 |

(Continued)

FOREIGN PATENT DOCUMENTS

EP 0399738 A2 * 11/1990 .............. H03M 3/02

OTHER PUBLICATIONS

Bonnie Baker, "How delta-sigma ADC's work, Part 1," Texas Instruments Incorporated, Analog Applications Journal, 3Q 2011, (6 Pages).

(Continued)

*Primary Examiner* — Thang V Tran
(74) *Attorney, Agent, or Firm* — Trop, Pruner & Hu, P.C.

(57) ABSTRACT

In one embodiment, an analog-to-digital converter includes: a sum circuit to receive an analog input signal and a feedback reference signal and generate a sum signal; a feedback circuit coupled to the sum circuit to provide the feedback reference signal to the sum circuit; a filter coupled to the sum circuit to receive the sum signal and generate a filtered signal; and a punctured quantizer coupled to the filter to receive the filtered signal and quantize the filtered signal to a digital output and to output the digital output and to provide the digital output to the feedback circuit.

19 Claims, 8 Drawing Sheets

(56) References Cited

U.S. PATENT DOCUMENTS

| | | | |
|---|---|---|---|
| 9,537,497 B2* | 1/2017 | Ho | H03M 3/37 |
| 10,715,156 B1 | 7/2020 | Coban | |
| 10,931,300 B1 | 2/2021 | Coban et al. | |
| 2007/0241950 A1* | 10/2007 | Petilli | H03M 1/0663 |
| | | | 341/143 |
| 2008/0272945 A1* | 11/2008 | Melanson | H02M 1/4225 |
| | | | 341/143 |
| 2015/0069985 A1* | 3/2015 | Wilson | H03F 1/0227 |
| | | | 323/271 |
| 2022/0141586 A1* | 5/2022 | Shajaan | H03M 1/48 |
| | | | 381/94.1 |

OTHER PUBLICATIONS

Douglas G. Marsh, et al; "A Single-Chip CMOS PCM Codec, with Filters," IEEE Journal of Solid-State Circuits, vol. SC-16, No. 4, Aug. 1981, pp. 308-315.

* cited by examiner

ANALOG-TO-DIGITAL CONVERTER HAVING PUNCTURED QUANTIZER

BACKGROUND

Certain Internet of Things (IoT) and wireless devices operate on battery power, such that power consumption can be a concern. As such, many of these devices spend most of their time in a deep sleep state when not used. Some devices may include sound detection circuitry to detect a trigger that leads to a sound activation of the device. For example, a voice command such as "Turn on lights" or the sound of breaking glass may activate the device to take appropriate action. Typically, a sound detection circuit includes a microphone, amplification, analog-to-digital conversion (ADC), digital signal processing and some manner to identify the detected signal.

Particularly in battery-operated devices, sound detection circuitry may desirably operate at extremely low current consumption levels. At the same time, for acceptable performance a conventional ADC is designed to achieve higher signal to noise and distortion ratio (SNDR) as the input signal's amplitude increases. Using this approach, if a required dynamic range is 70 decibels (dB) and the worst case SNDR is 30 dB, this suggests that at maximum input signal, the SNDR would be 100 dB. Such requirements can lead to higher power consumption since complicated and high power consuming circuitry is needed.

SUMMARY OF THE INVENTION

In one aspect, an apparatus includes: a sum circuit to receive an analog input signal and a feedback reference signal and generate a sum signal; a feedback circuit coupled to the sum circuit to provide the feedback reference signal to the sum circuit; a filter coupled to the sum circuit to receive the sum signal and generate a filtered signal; and a punctured quantizer coupled to the filter to receive the filtered signal and quantize the filtered signal to a digital output and to output the digital output and to provide the digital output to the feedback circuit.

In an example, the punctured quantizer comprises a non-linear quantizer having a plurality of levels, the plurality of levels related but having one or more gaps between at least some of the plurality of levels. The one or more gaps may include at least one linear level between each of the plurality of levels, where the plurality of levels are non-linearly related. The plurality of levels may be programmable.

In an example, the punctured quantizer comprises: a plurality of comparators, each of the plurality of comparators to compare the filtered signal to a corresponding reference voltage level and to provide a comparison decision; and a logic circuit coupled to the plurality of comparators, the logic circuit to generate a plurality of outputs based on the comparator decision of the plurality of comparators. The logic circuit, in response to the comparison decision from a first one of the plurality of comparators that indicates that the filtered signal exceeds a first reference voltage level, is to send a control signal to the feedback circuit to cause the feedback circuit to provide the feedback reference signal having a level that exceeds a magnitude of the first reference voltage level.

In an example, the apparatus may further comprise a plurality of second filters, each of the plurality of second filters to receive one of the plurality of outputs and generate a filtered decimated value therefrom. The apparatus also may include: a plurality of scaling elements, each of the plurality of scaling elements coupled to one of the plurality of second filters to scale the filtered decimated value from the corresponding second filter; and a second sum circuit to receive the scaled filtered decimated values and to generate the digital output therefrom. The logic circuit may provide a feedback control signal to the feedback circuit to cause the feedback circuit to provide a selected one of the plurality of feedback reference signals to the sum circuit.

In an example, the apparatus further includes a sigma-delta modulator comprising a non-linear N-th order modulator, the sigma-delta modulator comprising the filter, the quantizer and the feedback circuit. The apparatus may be a non-linear sigma-delta ADC to receive the analog input signal with a dynamic range having a first range, the non-linear sigma-delta ADC having a signal to noise and distortion ratio that is intentionally limited to a substantially fixed saturation level regardless of a magnitude of the analog input signal. The apparatus may further include an offset circuit, where the offset circuit is to compensate for an offset based at least in part on the digital output.

In another aspect, a method includes: receiving, in a sum circuit of an ADC, an analog input signal and summing the analog input signal with a feedback reference signal to generate a sum signal; filtering, in a filter of the ADC, the sum signal to output a filtered signal; quantizing, in a punctured quantizer of the ADC, the filtered signal to form a quantized signal, the punctured quantizer having more than two levels, where at least some of the more than two levels are non-linear; and generating a digital output based on the quantized signal, the digital output corresponding to the analog input signal.

In an example, the method further comprises: sending a control signal from the punctured quantizer to a feedback circuit to cause the feedback circuit to generate the feedback reference signal, where the feedback circuit is to generate, in response to the control signal, the feedback reference signal with a selected one of more than two feedback levels, where at least some of the more than two feedback levels are non-linear. The method may further comprise sending a representation of the digital output to a machine learning classifier, where the machine learning classifier is to determine if the analog input signal is a trigger, based at least in part on the digital output. The quantized signal may have a digital encoding, and the method may further include scaling the digital encoding with a plurality of scaling elements, each of the plurality of scaling elements associated with one of the more than two levels. The method may also include summing a scaled output from each of the plurality of scaling elements to generate the digital output.

In yet another aspect, an apparatus comprises: an audio sensor to receive an audio signal; at least one amplifier to provide gain to the audio signal; and a noise shaping sigma-delta ADC coupled to the at least one amplifier. The noise shaping sigma-delta ADC may include: a filter to receive an analog representation of the audio signal and generate a filtered signal; and a punctured quantizer coupled to the filter to receive the filtered signal and quantize the filtered signal to a digital output, the punctured quantizer having more than two levels, where the more than two levels have a non-linear relationship. The apparatus may further include a controller coupled to the noise shaping sigma-delta ADC, the controller to receive the digital output and perform an operation based at least in part on the digital output. In an example, the noise shaping sigma-delta ADC is configured with a SNDR that increases with a level of the analog representation to a predetermined level at which the SNDR reaches a maximum level, the maximum level below a dynamic range of the noise shaping sigma-delta ADC.

In an example, the punctured quantizer comprises: a plurality of comparators, each of the plurality of comparators to compare the filtered signal to a corresponding reference voltage level of the more than two levels and to provide a comparison decision; and a logic circuit coupled to the plurality of comparators, the logic circuit to generate a digital encoding based on the comparator decision of the plurality of comparators, where the digital encoding is to be scaled and summed to generate the digital output.

DETAILED DESCRIPTION

In various embodiments, an analog-to-digital converter (ADC) may be configured to provide a desired level of signal to noise and distortion ratio (SNDR) that has at least a substantially fixed value for all input signal levels (or at least a minimum value for all input signal levels). In this way, with lower SNDR requirements, the ADC may be designed with certain simplifications and operate at lower power consumption.

This ADC is designed to achieve high dynamic range (e.g., 70 dB) while producing a minimum SNDR (e.g., 30 dB), and thus achieving extremely low power consumption. That is, an ADC in accordance with an embodiment may only require a SNDR of 30 dB for all input signal levels. By taking this lower SNDR requirement into account, significant simplifications and lower power consumption can be achieved.

In embodiments, a noise shaping ADC may be provided with oversampling and greater than two levels of feedback. As will be described a quantizer of the ADC is not linear; however a feedback digital-to-analog converter (DAC) is nominally linear. This arrangement may achieve a wide dynamic range (e.g., 70 dB) and have a SNDR, due to quantization error, that is intentionally limited to a substantially fixed maximum or saturation value (e.g., 70 dB), rather than increasing linearly with input signal level. As a result, the ADC may minimize current consumption, chip area and complexity by this control of the quantization error. That is, embodiments may simplify the system with respect to quantization error. But if the ADC is thermal or 1/f noise limited, the power consumption may be limited as circuit noise could dominate the power consumption. Further the ADC may have a smaller area, easier anti-aliasing due to a higher oversampling rate (OSR) and much more modest element matching requirements, particularly as compared to conventional charge redistribution μ-law or A-law ADCs.

Although embodiments are not limited in this regard, one particular use case for such an ADC may be in connection with receipt of real world analog signals such as audio signals that may be received via a microphone. Some IoT devices may incorporate a microphone or other audio sensor, where the device is configured to be maintained in an inactive or low power state until a trigger signal is received. This trigger signal may be a voice activation such as the familiar "Siri" or "Alexa" triggers for an Apple® device or Amazon® device, respectively. Other audio trigger signals may be in the context of a security device, which may be triggered to take some action in response to another type of audio input, such as a glass break event or so forth. Of course, there are many other use cases for an ADC such as described herein.

Figure 1:
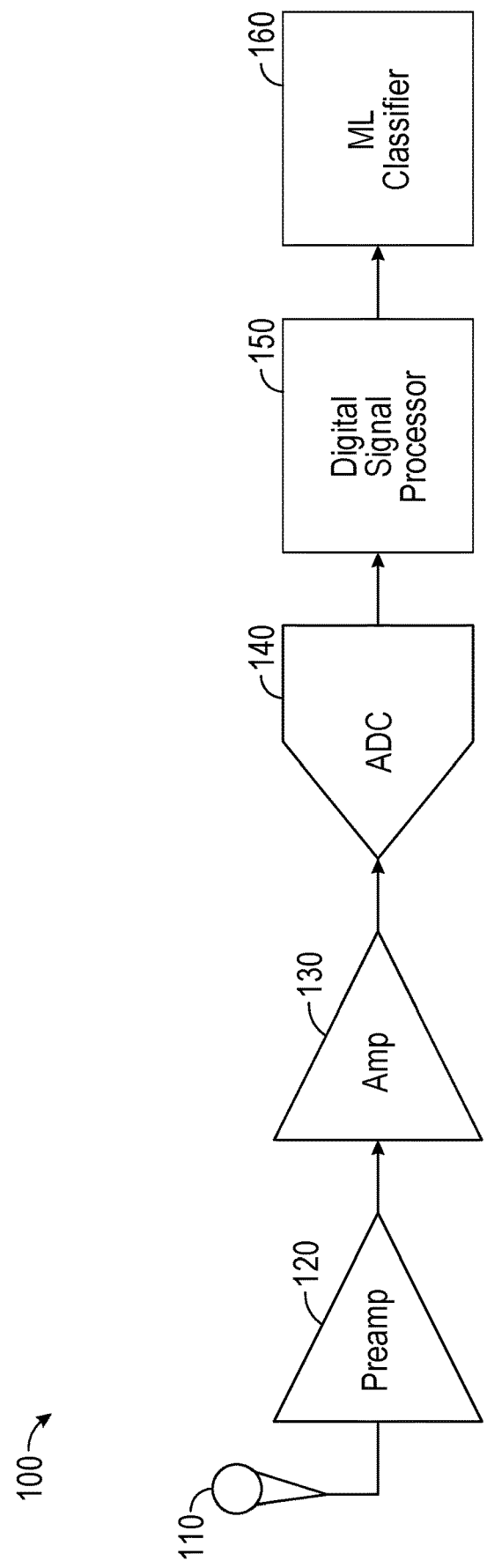
FIG. 1 is a block diagram of a portion of a device in accordance with an embodiment.

Referring now to FIG. 1, shown is a block diagram of a portion of a device in accordance with an embodiment. As shown in FIG. 1, device 100 may be any type of device incorporating one or more integrated circuits (ICs). In typical implementations herein, device 100 may be an Internet of Things (IoT) device.

As illustrated, device 100 includes a microphone or other audio sensor 110 that receives an audio input and in response generates an analog signal. As shown, the signal is provided to a preamplifier 120 and, optionally, another amplifier 130. Amplifier 130 may be configured as a fixed or programmable amplifier, depending upon implementation. These front end amplifier stages, along with potentially other analog front end circuitry such as filters or so forth, condition the input signal to be within a desired range when it is provided to an ADC 140.

In embodiments herein, ADC 140 may be configured as a sigma-delta (ΣΔ) ADC. As will be described further herein, ADC 140 may be configured for a high dynamic range with a limited SNDR. In one or more embodiments, ADC 140 may have a non-linear quantizer. That is, ADC 140 may be a multi-level ADC, where the different levels are not necessarily linearly spaced. More accurately, the quantizer may be implemented with multiple levels where at least some levels intentionally are not included such that steps between at least some of the present levels are not linear. Stated another way, this quantizer is a so-called punctured quantizer as its range is segmented into multiple non-linear levels, with one or more linear levels between the present levels eliminated. In different embodiments, the quantizer may have a logarithmic input output transfer characteristic, or a μ-law or A-law compression characteristic. This quantizer may be created by starting with a linear quantizer and intentionally deleting most levels.

ADC 140 may further include a feedback DAC for quantization shaping to provide feedback signals of selected levels, where there may be two or more such levels (with each level having positive and negative values). In some embodiments, the feedback DAC may utilize dynamic element matching, optionally. ADC 140 may be viewed as a one-bit ADC that only uses a feedback level that exceeds the input signal. With this arrangement, a minimum input signal may only use minimum reference feedback levels, while a maximum input signal may use all levels, but primarily the maximum feedback reference levels.

As further shown in FIG. 1, the digital output from ADC 140 may be provided to a digital signal processor (DSP) 150 and then to a machine learning (ML) classifier 160. In an embodiment, ML classifier 160 may be implemented in DSP, a microcontroller or general-purpose processing circuitry to execute instructions to implement a neural network of ML classifier 160. Of course, in other cases the digital output of ADC 140 may be provided to another destination circuit. ML classifier 160 may output a decision, which can indicate when the received audio signal is a given trigger for which the classifier is trained. Understand that an IoT or other device may take appropriate action in response to a trigger decision, such as waking up to perform an action, such as turning on a light, actuating an actuator, sending a message to a remote destination or so forth.

Figure 2:
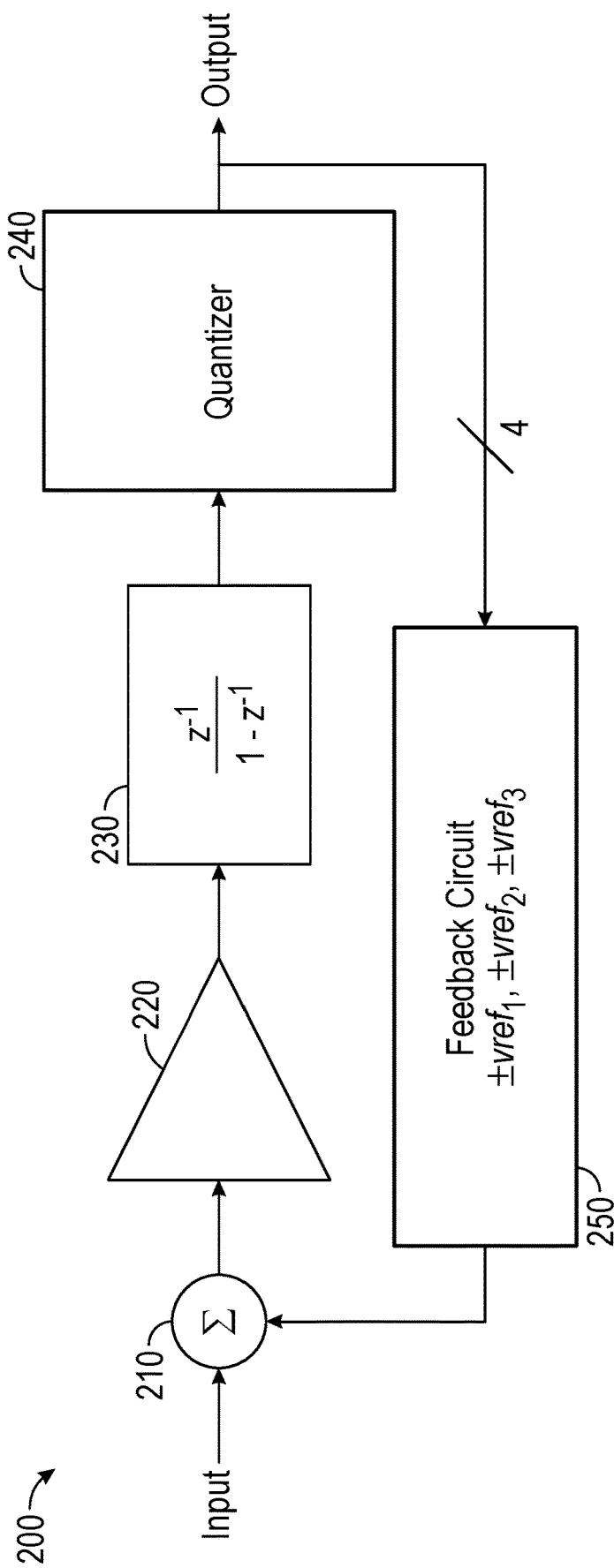
FIG. 2 is a block diagram of an ADC in accordance with an embodiment.

Referring now to FIG. 2, shown is a block diagram of an ADC in accordance with an embodiment. As shown in FIG. 2, ADC 200 may represent an implementation of ADC 140 of FIG. 1. In FIG. 2, ADC 200 may be implemented as a non-linear first-order ΣΔADC. As shown, an incoming signal, which may be any type of incoming analog signal detected by a given sensor, is received at a summer 210, where it may be summed with a received feedback signal, namely one of multiple reference voltages as described further below.

The resulting sum signal is provided to an amplifier 220, which may be a fixed or programmable amplifier, depending upon implementation. In one embodiment, amplifier 220 may be configured to have a gain of 0.5. In any event, the amplified signal is provided to a discrete-time filter 230. In the embodiment shown, filter 230 may be implemented as a first-order filter that provides a signal to a quantizer 240.

In embodiments herein, quantizer 240 may be implemented as a punctured quantizer, in that multiple levels of a plurality of linear (or other uniform) levels are intentionally omitted. In some embodiments, quantizer 240 may be configured with selectable (programmable) quantizer levels, e.g., to obtain different SNDRs over a given dynamic range, allowing optimization for different system applications. In some implementations, the SNDR may increase with input signal level, but saturate at a maximum level and further be bound between the maximum and minimum level. In such implementations, the SNDR parameters may be determined by the number of quantizer levels, placement of quantizer levels, OSR and modulator order.

The resulting quantized signal, namely a digital output representing the analog input, may be output to a destination, e.g., a given processing circuit such as a ML classifier. In some cases, the digital output may be provided to intervening circuitry such as a DSP for further processing before being sent to a classifier.

As shown in FIG. 2, the digital output (or a feedback control signal based on the digital output) further may be provided to a feedback circuit 250, which based upon a level of the digital output, may provide a given one of multiple feedback voltages (or feedback currents, depending on the embodiment), in the form of a reference voltage back to summer 210. Note generally that the circuitry including summer 210, filter 230, quantizer 240 and feedback circuit 250 may be considered to be a modulator, i.e., a sigma-delta modulator.

Understand while shown at this high level in the embodiment of FIG. 2, many variations and alternatives are possible. For example while feedback circuit 250 is illustrated with a configuration to generate a selected one of six different reference voltage levels, additional or different reference voltage levels may be present in other embodiments. These reference voltage levels may have a non-linear relationship such as different powers of two. Of course, other relations such as logarithmic maybe be possible. Further, while amplifier 220 is shown in FIG. 2, understand that in other cases such amplifier may be an optional feature.

Other variations are possible. For example, an offset circuit may be provided to remove a DC offset. In an example, this offset may receive the digital output and based at least in part on the digital output, generate an offset value that may be provided as further feedback to summer 210. In other cases, the active circuit's offset can be eliminated by an auto-zeroing phase, chopper stabilization or a foreground or background calibration operation.

Figure 3:
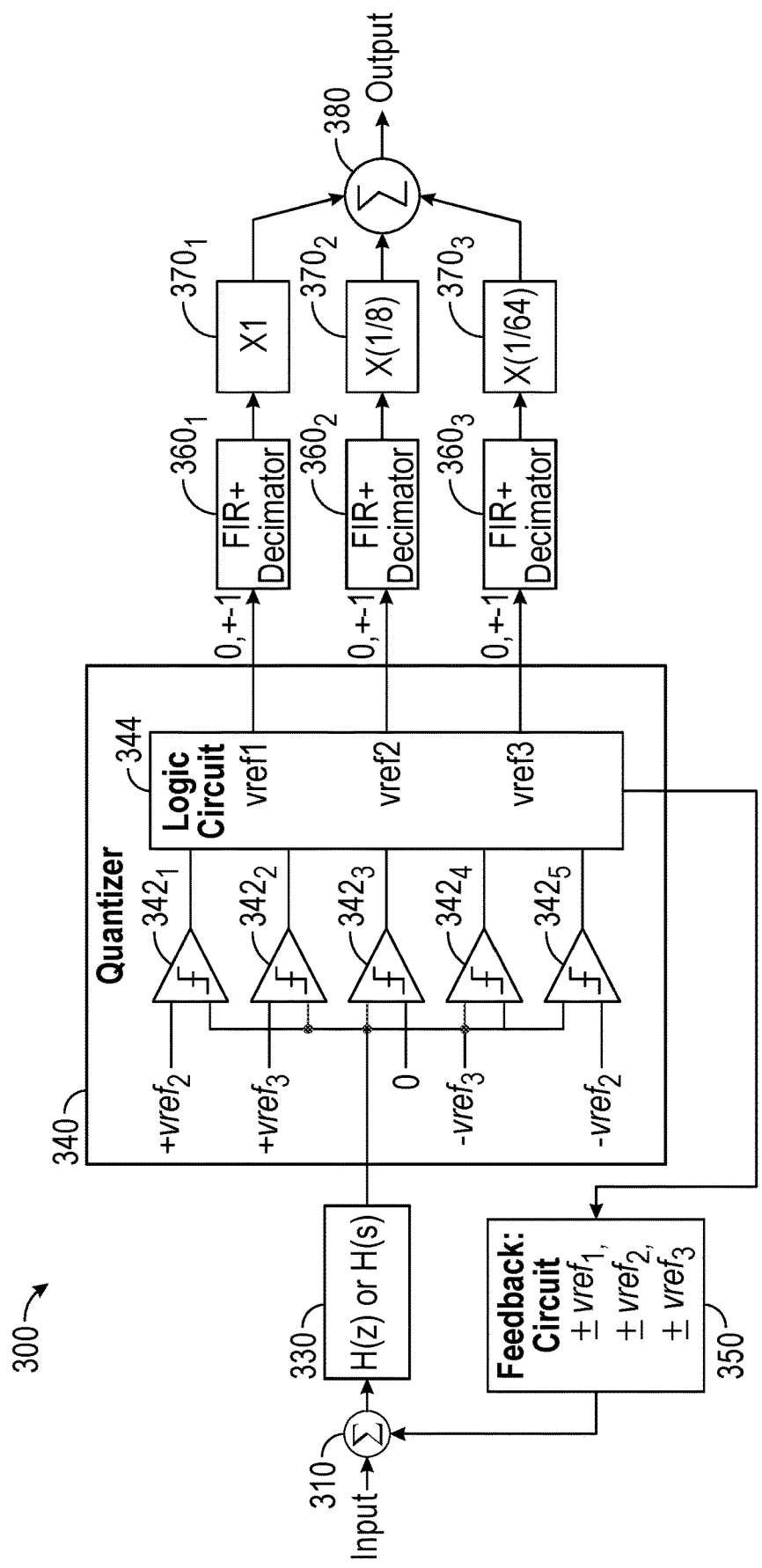
FIG. 3 is a block diagram illustrating a more detailed arrangement of an ADC environment in accordance with an embodiment.

Referring now to FIG. 3, shown is a block diagram illustrating a more detailed arrangement of an ADC environment in accordance with an embodiment. As illustrated, ADC 300 may be a more detailed implementation of the non-linear Nth-order ΣΔADC of FIG. 2. Accordingly, like components are not further described and are identified with the same numbering scheme as in FIG. 2 (albeit of the "300" series in FIG. 3, rather than with the "200" series of FIG. 2).

As shown, an incoming signal is provided to summer 310, which sums the signal with a feedback signal received from feedback circuit 350. The resulting signal is provided to filter 330. As shown, filter 330 may be a continuous-time or discrete-time filter (or a combination of a discrete-time and continuous-time filters), and as described above may be implemented as a first-order filter. In other cases, a higher-order filter may be used, e.g., an $N^{th}$-order filter, where N is greater than 1. In any event, the filtered signal is provided to punctured quantizer 340.

As illustrated in FIG. 3, punctured quantizer 340 includes a plurality of comparators $342_1$-$342_5$. Each comparator has a first input to receive the filtered signal and a second input to receive a given reference voltage. As illustrated, these reference voltage levels may be fixed, with comparator $342_3$ receiving a ground voltage level of zero volts, while comparators $340_{1,5}$ receive +/−VREF2 and comparators $342_{2,4}$ receive +/− VREF3. In an embodiment, quantizer 340 may be intentionally designed with minimal and non-linear levels. For example, the three levels may be set at +−1, +−⅛, +−1/64 (with respect to a unity reference voltage VREF1.

Accordingly, each comparator 342 may compare the received input signal with the corresponding reference voltage level. In an embodiment, each comparator 342 may be configured to output a high voltage when the input signal exceeds the reference voltage level and output a low voltage when the input signal is less than the reference voltage level. These comparator decisions are provided to a logic circuit 344. Logic circuit 344 may be configured to output an encoding based on the comparator decisions. Specifically, each of three output signals may be at a level of zero or plus/minus one. However, for a given sample only a single output is non-zero.

As shown, the logic outputs are provided to corresponding finite impulse response (FIR) filters and decimators $360_{1-3}$ (generally referred to herein as "FIRs" or "filters"), which may generate decimated filtered outputs in turn provided to scaling elements $370_1$-$370_3$. As shown, these scaling elements may scale the received signals in accordance with the levels of punctured quantizer 340, namely, X/1, X/8 and X/64. The resulting scaled outputs are provided to a summer 380, where they may be summed to generate the digital output corresponding to the received analog signal.

As further illustrated in FIG. 3, logic circuit 344 further may generate a feedback signal that is provided to feedback circuit 350. As shown, feedback circuit 350 may generate a selected one of a plurality of feedback reference voltages: in the illustration of FIG. 3 these voltages may be at +−VREF1, VREF2 and VREF3, where VREF2=(⅛)VREF1, and VREF3=(1/64)VREF1. With these values, circuit concerns are eased, as multiplications can be avoided, given that these values are all powers of two, and mathematical operations may be realized via shift circuitry.

Feedback circuit 350, in turn, may generate a given one of the illustrated reference voltage levels based on this received feedback signal. More specifically in one embodiment, the logic operation of logic circuit 344 may be in accordance with Table 1, below.

TABLE 1

The comparators work as follows for positive inputs:
Case 1: vin > 0 & vin < vref3 & vin < vref2
   Feedback = +vref3
   Logic to decimator: = 0 0 1    if scaling= ($\times 1 \times \frac{1}{8} \times \frac{1}{64}$),
                                   so binary equivalent is 0 000 001
Case 2: vin > 0 & vin >= vref3 & vin < vref2
   Feedback = +vref2
   Logic to decimator: = 0 1 0    binary equivalent is 0 001 000
Case 3: vin > 0 & vin >= vref3 & vin >= vref2
   Feedback = +vref1
   Logic to decimator: = 1 0 0    binary equivalent is 1 000 000
The comparators work as follows for negative inputs:
Case 4: vin <= 0 & vin > − vref3 & vin > − vref2
   Feedback = −vref3
   Logic to decimator: = 0 0 −1   if scaling= ($\times 1 \times \frac{1}{8} \times \frac{1}{64}$),
                                   so binary equivalent is − 0 000 001
Case 5: vin < 0 & vin <= − vref3 & vin > −vref2
   Feedback = −vref2
   Logic to decimator: = 0 −1 0   binary equivalent is − 0 001 000
Case 6: vin < 0 & vin < −vref3 & vin <= −vref2
   Feedback = −vref1
   Logic to decimator: = −1 0 0   binary equivalent is − 1 000 000

Figure 4A:
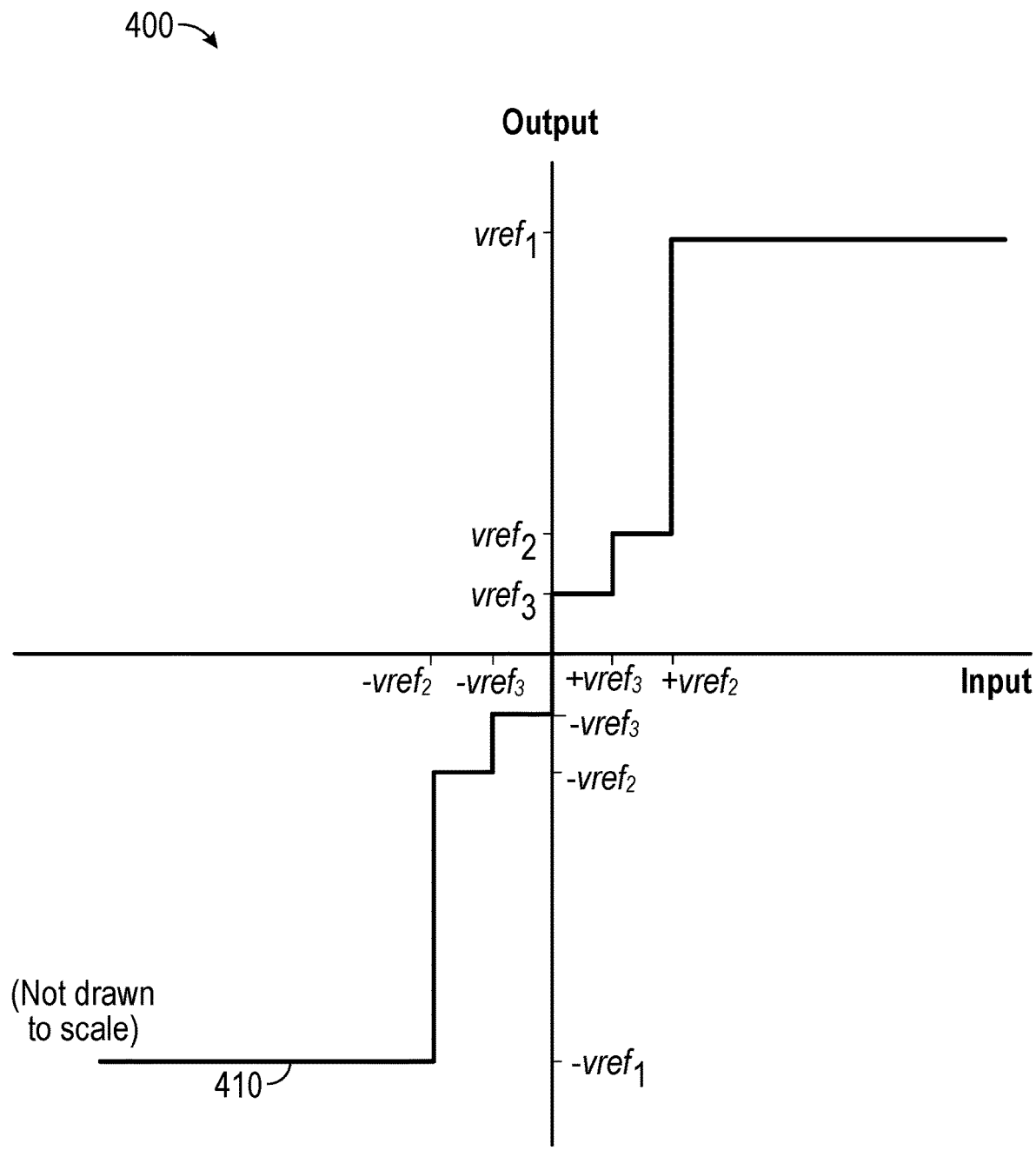
FIG. 4A is a graphical illustration of a transfer characteristic for a punctured quantizer in accordance an embodiment.

Referring now to FIG. 4A, shown is a graphical illustration of a transfer characteristic for a punctured quantizer 340 in accordance with an embodiment. As shown in FIG. 4A, illustration 400 includes a transfer function 410 demonstrating the non-linear transfer function of input signal (X axis) to output signal (Y axis). As shown, when the input signal is of a smaller range, more steps are impacted to provide finer resolution, while at higher input voltage levels fewer but larger steps are impacted. Understand while shown with only three positive and three negative steps in the embodiment of FIG. 4A, additional steps may be present while maintaining non-linearity.

Figure 4B:
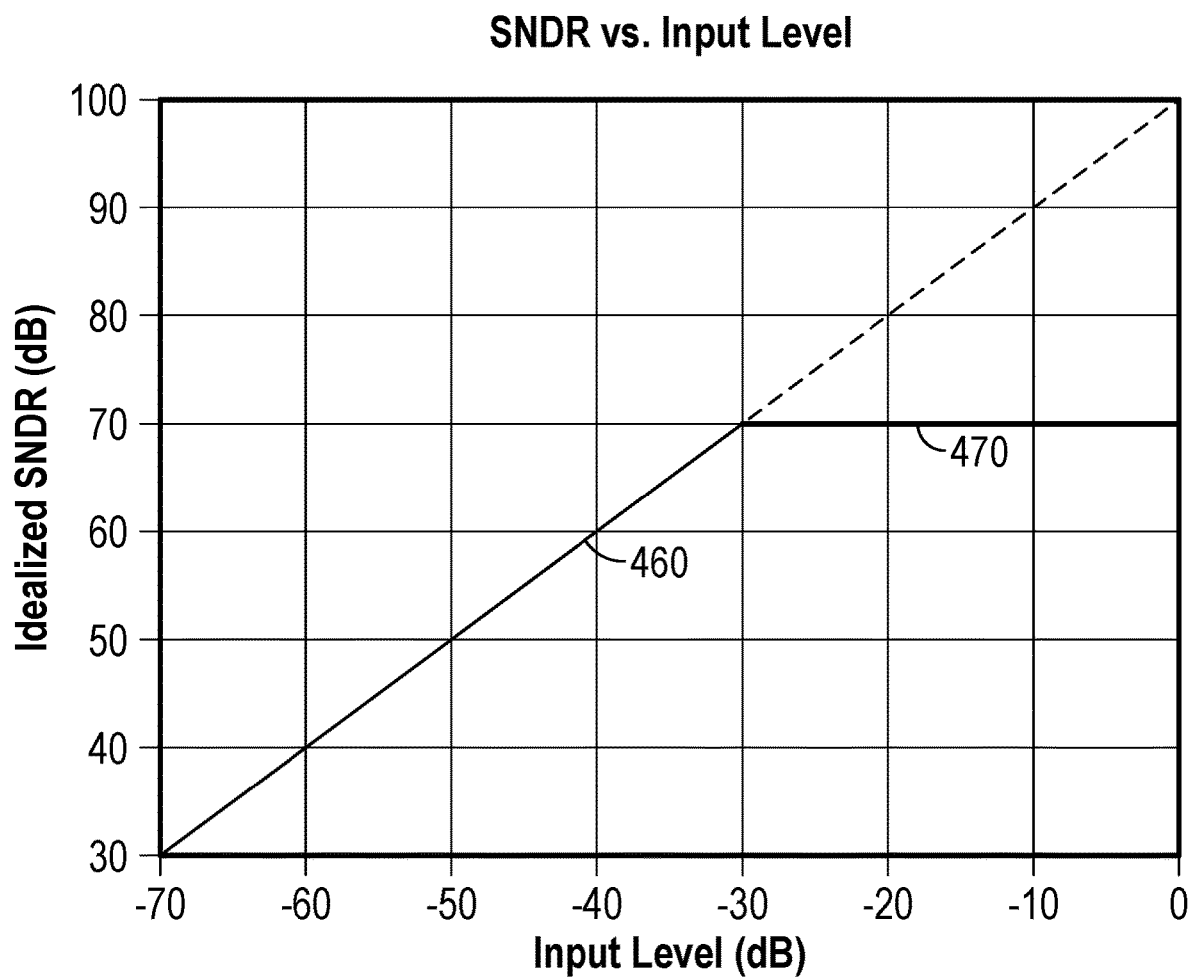
FIG. 4B is a graphical illustration of signal to noise and distortion ratio versus input level in accordance with an embodiment.

FIG. 4B is a graphical illustration of signal to noise and distortion ratio versus input level in accordance with an embodiment. As shown in illustration 450, the input signal level is represented along the X axis, while the SNDR is represented along the Y axis. A substantially linear curve 460 represents an optimized curve where SNDR increases linearly with input signal.

However as discussed above, such stringent requirements may increase complexity and power consumption of an ADC. Instead with an ADC in accordance with an embodiment, as input signal increases the SNDR may become saturated at a predetermined acceptable level (e.g., with approximately 70 dB range as shown at curve 470). In this way, the ADC may be designed with less complexity and operate at lower power consumption, since operation with additional SNDR (shown in the dashed portion of curve 460) may be avoided.

Figure 5:
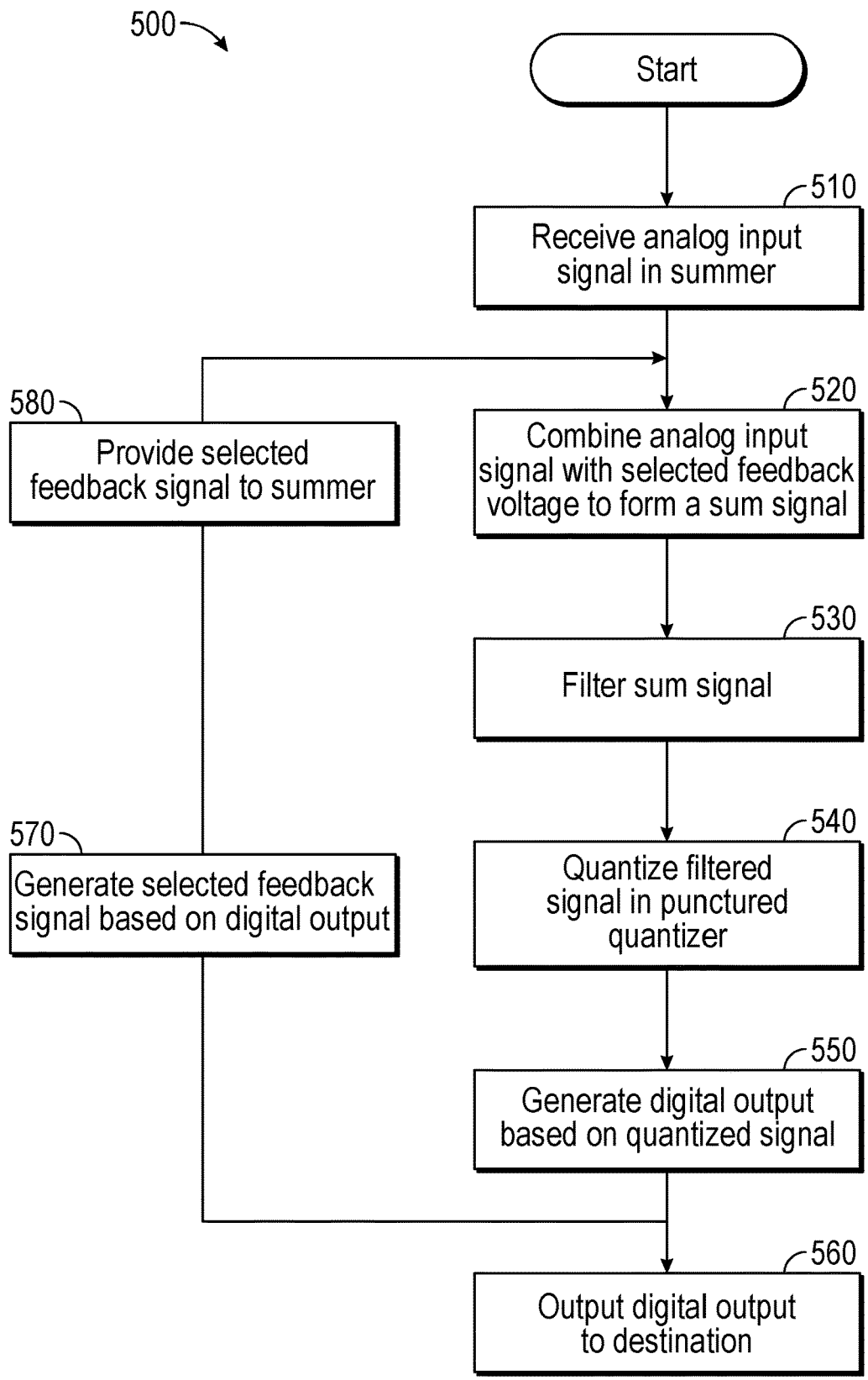
FIG. 5 is a flow diagram of a method in accordance with an embodiment.

Referring now to FIG. 5, shown is a flow diagram of a method in accordance with an embodiment. Method 500 is a method for performing analog to digital conversions in an ADC in accordance with an embodiment. As shown, method 500 begins by receiving an analog input signal in a summer of the ADC (block 510). In the summer, this signal is combined with a feedback voltage to form a sum signal (block 520). As discussed above, this feedback voltage may be a selected one of multiple levels generated in a feedback DAC in response to a control signal from a quantizer.

Still referring to FIG. 5, next at block 530, the sum signal is filtered. This filtered signal may then be quantized in a punctured quantizer (block 540). The quantizer may, via its logic circuitry, generate a digital encoding of its comparator decisions. As described above the punctured quantizer includes more than two levels, at least some of which are non-linearly related.

The digital encoding output from the quantizer may be used to generate a digital output. For example, the digital encoding can be filtered, decimated and scaled. This scaling may have weightings in proportion with the feedback voltage levels. In turn, the scaled values may be summed, to result in a digital output corresponding to the analog input signal. As shown at block 550, this digital output may be sent to a given destination, e.g., a ML classifier.

FIG. 5 further shows the feedback operation of the ADC. Specifically, at block 570 a feedback DAC may generate a selected feedback signal based on the digital output. More particularly, the feedback DAC may receive a control signal (which in some cases may be the same as the digital encoding output from the quantizer). In turn, the selected feedback signal is provided to the summer (block 580), which as shown at block 520, combines it with the analog input signal.

Figure 6:
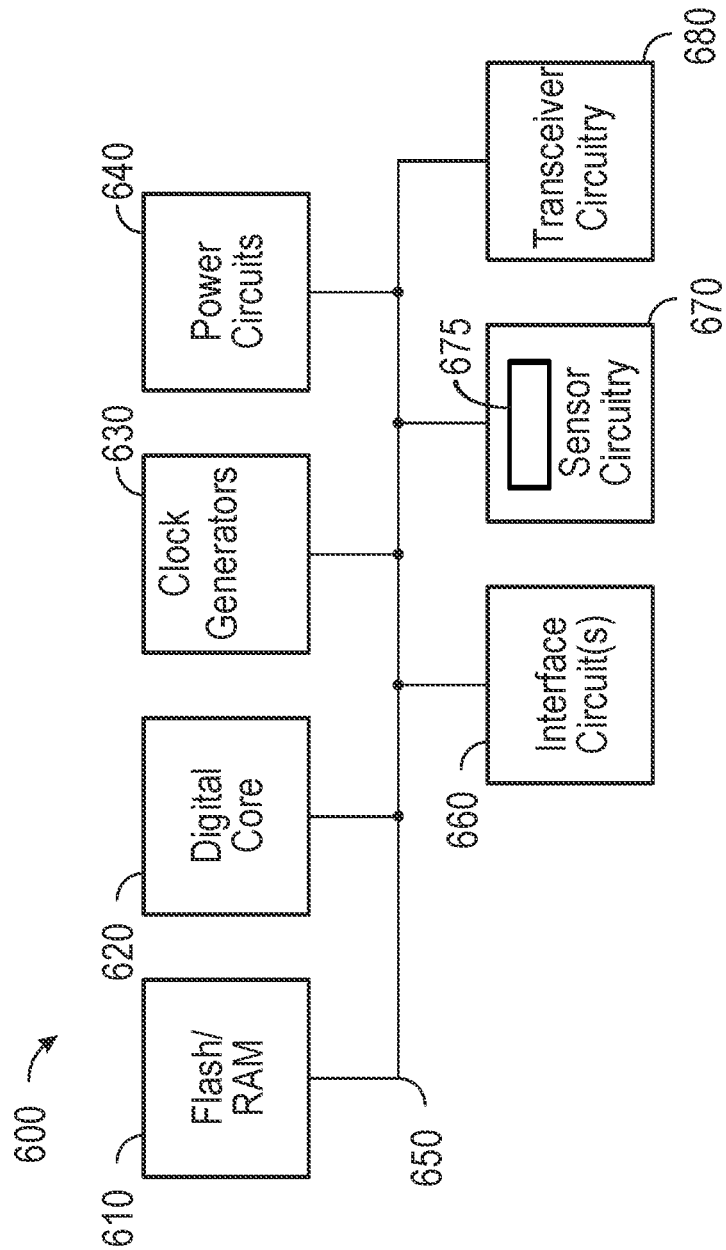
FIG. 6 is a block diagram of a representative integrated circuit that includes ADC and related circuitry in accordance with an embodiment.

Referring now to FIG. 6, shown is a block diagram of a representative integrated circuit 600 that includes ADC and related circuitry as described herein. In the embodiment shown in FIG. 6, integrated circuit 600 may be, e.g., a microcontroller, wireless transceiver that may operate according to one or more wireless protocols (e.g., WLAN-OFDM, WLAN-DSSS, Bluetooth, among others), or other device that can be used in a variety of use cases, including sensing, metering, monitoring, embedded applications, communications, applications and so forth, and which may be particularly adapted for use in an IoT device.

In the embodiment shown, integrated circuit 600 includes a memory system 610 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions, including instructions for controlling an ADC (e.g., controlling programmable reference feedback levels) and classifying digital outputs from the ADC, as described herein.

Memory system 610 couples via a bus 650 to a digital core 620, which may include one or more cores and/or microcontrollers that act as a main processing unit of the integrated circuit. Such digital core 620 may perform ML classifications of digital information generated in an ADC from analog input signals obtained from one or more sensors. In turn, digital core 620 may couple to clock generators 630 which may provide one or more phase locked loops or other clock generator circuitry to generate various clocks for use by circuitry of the IC. As further illustrated, IC 600 further includes power circuitry 640, which may include one or more voltage regulators. Additional circuitry may optionally be present depending on particular implementation to provide various functionality and interaction with external devices. Such circuitry may include interface circuitry 660 which may provide interface with various off-chip devices, sensor circuitry 670 which may include various on-chip sensors including digital and analog sensors to sense desired signals, such as for a metering application or so forth. As shown sensor circuitry 670 may include an ADC 675 configured in accordance with an embodiment.

In addition as shown in FIG. 6, transceiver circuitry 680 may be provided to enable transmission and receipt of wireless signals, e.g., according to one or more of a local area or wide area wireless communication scheme, such as Zigbee, Bluetooth, IEEE 802.11, IEEE 802.15.4, cellular communication or so forth. Understand while shown with this high level view, many variations and alternatives are possible.

Note that ICs such as described herein may be implemented in a variety of different devices such as an IoT device. This IoT device may be, as two examples, a smart bulb of a home or industrial automation network or a smart utility meter for use in a smart utility network, e.g., a mesh network in which communication is according to an IEEE 802.15.4 specification or other such wireless protocol.

Figure 7:
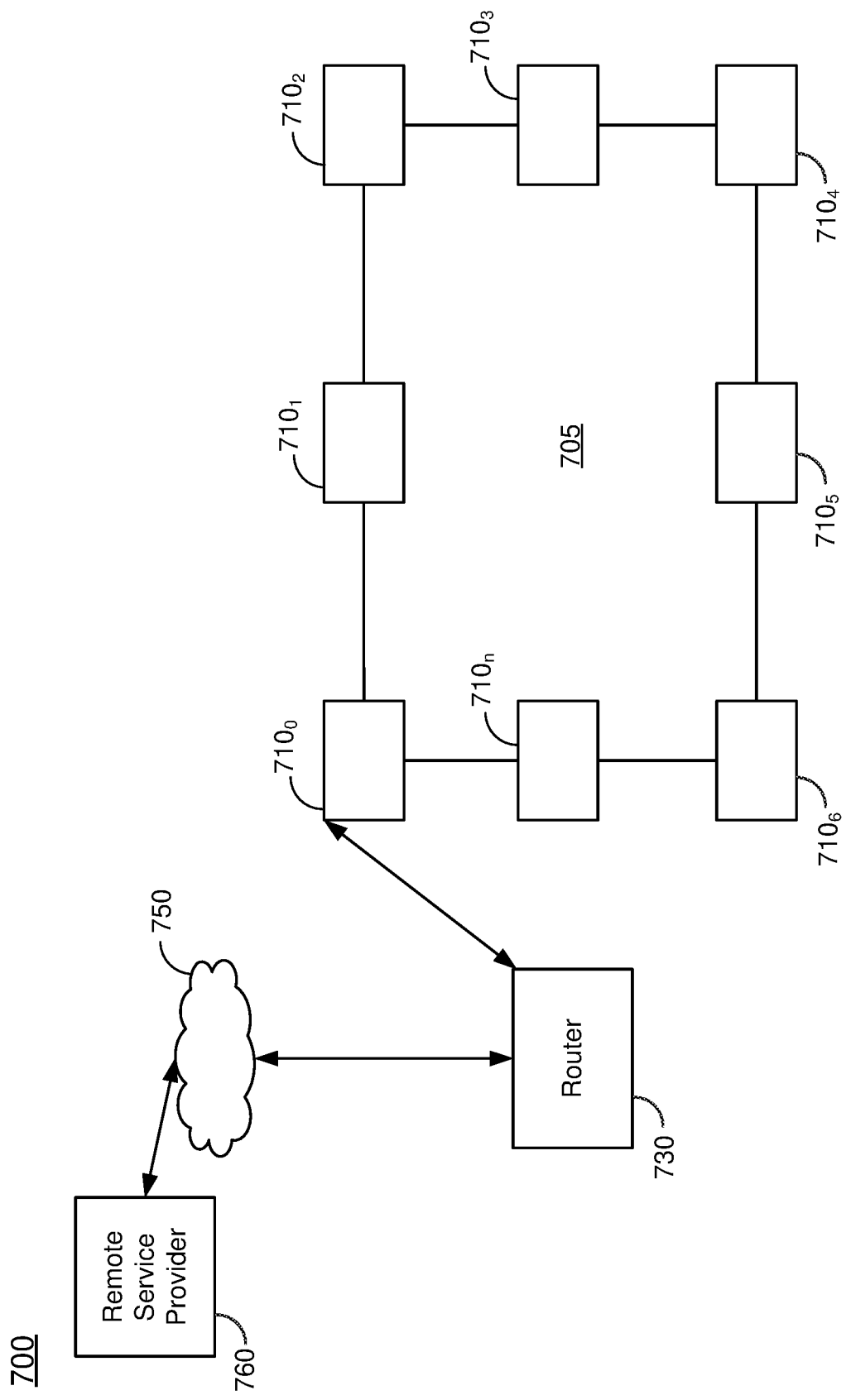
FIG. 7 is a high level diagram of a network in accordance with an embodiment.

Referring now to FIG. 7, shown is a high level diagram of a network in accordance with an embodiment. As shown in FIG. 7, a network 700 includes a variety of devices, including smart devices such as IoT devices, routers and remote service providers. In the embodiment of FIG. 7, a mesh network 705 may be present, e.g., in a building having multiple IoT devices $710_{0-n}$. Such IoT devices may perform ADC conversions using an ADC as described herein. As shown, at least one IoT device $710_0$ couples to a router 730 that in turn communicates with a remote service provider 760 via a wide area network 750, e.g., the internet. In an embodiment, remote service provider 760 may be a backend server of a utility that handles communication with IoT devices 710. Understand while shown at this high level in the embodiment of FIG. 7, many variations and alternatives are possible.

While the present disclosure has been described with respect to a limited number of implementations, those skilled in the art, having the benefit of this disclosure, will appreciate numerous modifications and variations therefrom. It is intended that the appended claims cover all such modifications and variations.

What is claimed is:

1. An apparatus comprising:
a sum circuit to receive an analog input signal and a feedback reference signal and generate a sum signal;
a feedback circuit coupled to the sum circuit to provide the feedback reference signal to the sum circuit;
a filter coupled to the sum circuit to receive the sum signal and generate a filtered signal; and
a punctured quantizer coupled to the filter to receive the filtered signal and quantize the filtered signal to a digital output and to output the digital output and to provide the digital output to the feedback circuit, the punctured quantizer comprising a non-linear quantizer having a plurality of levels, the plurality of levels related but having one or more gaps between at least some of the plurality of levels.

2. The apparatus of claim 1, wherein the one or more gaps comprise at least one linear level between each of the plurality of levels, wherein the plurality of levels are non-linearly related.

3. The apparatus of claim 1, wherein the plurality of levels are programmable.

4. The apparatus of claim 1, wherein the punctured quantizer further comprises:
a plurality of comparators, each of the plurality of comparators to compare the filtered signal to a corresponding reference voltage level of the plurality of levels and to provide a comparison decision; and
a logic circuit coupled to the plurality of comparators, the logic circuit to generate a plurality of outputs based on the comparison decision of the plurality of comparators.

5. The apparatus of claim 4, wherein the logic circuit, in response to the comparison decision from a first one of the plurality of comparators that indicates that the filtered signal exceeds a first reference voltage level, is to send a control signal to the feedback circuit to cause the feedback circuit to provide the feedback reference signal having a level that exceeds a magnitude of the first reference voltage level.

6. The apparatus of claim 4, further comprising a plurality of second filters, each of the plurality of second filters to receive one of the plurality of outputs and generate a filtered decimated value therefrom.

7. The apparatus of claim 6, further comprising:
a plurality of scaling elements, each of the plurality of scaling elements coupled to one of the plurality of second filters to scale the filtered decimated value from the corresponding second filter; and
a second sum circuit to receive the scaled filtered decimated values and to generate the digital output therefrom.

8. The apparatus of claim 6, wherein the logic circuit is to provide a feedback control signal to the feedback circuit to cause the feedback circuit to provide a selected one of the plurality of feedback reference signals to the sum circuit.

9. The apparatus of claim 1, further comprising a sigma-delta modulator comprising a non-linear N-th order modulator, the sigma-delta modulator comprising the filter, the quantizer and the feedback circuit.

10. The apparatus of claim 1, wherein the apparatus comprises a non-linear sigma-delta analog-to-digital converter (ADC), the non-linear sigma-delta ADC to receive the analog input signal with a dynamic range having a first range, the non-linear sigma-delta ADC having a signal to noise and distortion ratio that is intentionally limited to a substantially fixed saturation level regardless of a magnitude of the analog input signal.

11. The apparatus of claim 1, further comprising an offset circuit, wherein the offset circuit is to compensate for an offset based at least in part on the digital output.

12. A method comprising:
receiving, in a sum circuit of an analog-to-digital converter (ADC), an analog input signal and summing the analog input signal with a feedback reference signal to generate a sum signal;
filtering, in a filter of the ADC, the sum signal to output a filtered signal;
quantizing, in a punctured quantizer of the ADC, the filtered signal to form a quantized signal, the punctured quantizer having more than two levels, wherein at least some of the more than two levels are non-linear; and
generating a digital output based on the quantized signal, the digital output corresponding to the analog input signal.

13. The method of claim 12, further comprising:
sending a control signal from the punctured quantizer to a feedback circuit to cause the feedback circuit to generate the feedback reference signal, wherein the feedback circuit is to generate, in response to the control signal, the feedback reference signal with a selected one of more than two feedback levels, wherein at least some of the more than two feedback levels are non-linear.

14. The method of claim 12, further comprising sending a representation of the digital output to a machine learning classifier, wherein the machine learning classifier is to determine if the analog input signal is a trigger, based at least in part on the digital output.

15. The method of claim 12, wherein the quantized signal comprises a digital encoding, and further comprising scaling the digital encoding with a plurality of scaling elements, each of the plurality of scaling elements associated with one of the more than two levels.

16. The method of claim 15, further comprising summing a scaled output from each of the plurality of scaling elements to generate the digital output.

17. An apparatus comprising:
an audio sensor to receive an audio signal;
at least one amplifier to provide gain to the audio signal;
a noise shaping sigma-delta analog-to digital converter (ADC) coupled to the at least one amplifier, the noise shaping sigma-delta ADC comprising:
a filter to receive an analog representation of the audio signal and generate a filtered signal; and
a punctured quantizer coupled to the filter to receive the filtered signal and quantize the filtered signal to a digital output, the punctured quantizer having more than two levels, wherein the more than two levels have a non-linear relationship; and
a controller coupled to the noise shaping sigma-delta ADC, the controller to receive the digital output and perform an operation based at least in part on the digital output.

18. The apparatus of claim 17, wherein the noise shaping sigma-delta ADC is configured with a signal to noise and distortion ratio (SNDR) that increases with a level of the analog representation to a predetermined level at which the SNDR reaches a maximum level, the maximum level below a dynamic range of the noise shaping sigma-delta ADC.

19. The apparatus of claim 17, wherein the punctured quantizer comprises:
a plurality of comparators, each of the plurality of comparators to compare the filtered signal to a corresponding reference voltage level of the more than two levels and to provide a comparison decision; and
a logic circuit coupled to the plurality of comparators, the logic circuit to generate a digital encoding based on the comparison decision of the plurality of comparators, wherein the digital encoding is to be scaled and summed to generate the digital output.

* * * * *